US012571469B2

(12) United States Patent
Winter et al.

(10) Patent No.: US 12,571,469 B2
(45) Date of Patent: Mar. 10, 2026

(54) CONTROL MODULE OF A VEHICLE

(71) Applicant: ZF CV Systems Europe BV, Brussels (BE)

(72) Inventors: Simon Winter, Peine (DE); Tobias Wustrack, Barsinghausen (DE); Hans Janzen, Hemmingen (DE)

(73) Assignee: ZF CV Systems Europe BV, Brussels (BE)

( * ) Notice: Subject to any disclaimer, the term of this patent is extended or adjusted under 35 U.S.C. 154(b) by 748 days.

(21) Appl. No.: 17/763,787

(22) PCT Filed: Sep. 3, 2020

(86) PCT No.: PCT/EP2020/074582
§ 371 (c)(1),
(2) Date: Mar. 25, 2022

(87) PCT Pub. No.: WO2021/058252
PCT Pub. Date: Apr. 1, 2021

(65) Prior Publication Data
US 2022/0333682 A1 Oct. 20, 2022

(30) Foreign Application Priority Data

Sep. 27, 2019 (DE) ..................... 10 2019 126 129.5

(51) Int. Cl.
*H05K 7/10* (2006.01)
*F16H 61/00* (2006.01)
(Continued)

(52) U.S. Cl.
CPC ....... *F16H 61/0003* (2013.01); *F16K 27/003* (2013.01); *H05K 5/0082* (2013.01); *H05K 7/10* (2013.01); *G01D 11/305* (2013.01)

(58) Field of Classification Search
CPC .. H05K 7/20; H05K 7/06; H05K 7/08; H05K 7/10; H05K 7/12; H05K 7/14
(Continued)

(56) References Cited

U.S. PATENT DOCUMENTS

| | | | | |
|---|---|---|---|---|
| 4,785,848 A | * | 11/1988 | Leiber | ................. F16H 61/0009 |
| | | | | 137/884 |
| 5,307,236 A | * | 4/1994 | Rio | ...................... H01L 23/4006 |
| | | | | 361/720 |

(Continued)

FOREIGN PATENT DOCUMENTS

| | | |
|---|---|---|
| DE | 3709505 A1 | 1/1988 |
| DE | 4344584 A1 | 6/1995 |

(Continued)

OTHER PUBLICATIONS

European Patent Office, Rijswijk, Netherlands, International Search Report of International Application No. PCT/EP2020/074582, Mailed Nov. 23, 2020, 3 pages.

*Primary Examiner* — Tuan T Dinh
(74) *Attorney, Agent, or Firm* — Dickinson Wright PLLC

(57) ABSTRACT

A control module of a vehicle includes a plurality of electromechanical functional elements arranged on a carrier plate and fixed in an interlocking and force-fitting manner to the carrier plate by clamping elements. The clamping elements are formed on a pressure plate that is secured to spacers of the carrier plate. To simplify production and fitting of the pressure plate provided with the clamping elements and to be able to use them with functional elements having different structural heights, the spacers have a slightly greater height than the structural height of the highest functional element. The pressure plate, for each of the functional elements, has at least one clamping element in the form of a clamping tab. The clamping tabs are each (Continued)

arranged at an opening in the pressure plate, which opening is partially closed by the clamping tabs, and are angled toward the carrier plate.

10 Claims, 3 Drawing Sheets

(51) Int. Cl.
    *F16K 27/00*           (2006.01)
    *H05K 5/00*            (2006.01)
    *G01D 11/30*         (2006.01)

(58) Field of Classification Search
    USPC ................................ 361/770–790, 807–810
    See application file for complete search history.

(56)              References Cited

U.S. PATENT DOCUMENTS

| | | | | |
|---|---|---|---|---|
| 5,316,204 | A * | 5/1994 | Takehashi | H01L 24/50 |
| | | | | 228/160 |
| 5,462,344 | A * | 10/1995 | Jakob | G05D 16/2026 |
| | | | | 137/884 |
| 5,802,699 | A * | 9/1998 | Fjelstad | H05K 7/1084 |
| | | | | 361/776 |
| 6,043,981 | A | 3/2000 | Markow et al. | |
| 6,266,244 | B1 * | 7/2001 | Guthrie | H01L 23/40 |
| | | | | 257/713 |
| 9,025,334 | B2 * | 5/2015 | Enami | H05K 7/2049 |
| | | | | 361/715 |
| 2009/0067131 | A1 * | 3/2009 | Yasuda | H01L 23/4093 |
| | | | | 361/707 |
| 2014/0146481 | A1 | 5/2014 | Subat | |
| 2015/0262907 | A1 * | 9/2015 | Degner | H01L 23/4006 |
| | | | | 165/104.26 |

FOREIGN PATENT DOCUMENTS

| | | | |
|---|---|---|---|
| DE | 102008045409 | A1 | 3/2009 |
| DE | 102012016925 | A1 | 2/2014 |
| DE | 102017002357 | A1 | 9/2018 |

* cited by examiner

CONTROL MODULE OF A VEHICLE

FIELD

The invention relates to a control module of a vehicle, in particular a control module having a plurality of electromechanical functional elements arranged on a carrier plate and positively and non-positively fixed to the carrier plate by clamping elements, where the clamping elements are realized on a pressure plate that is fastened to spacers of the carrier plate.

BACKGROUND

Electromechanical functional elements such as solenoid valves, pressure sensors, and temperature sensors of a transmission control, are preferably combined in a control module, as they are more easily mounted and can be more easily protected against harmful influences from splash water and oil, as well as against mechanical damage.

In order to avoid the need for each individual functional element to be laboriously fastened in the control module by, for example, two screws or two latching lugs, there was proposed in DE 10 2017 002 357 A1 a fastening arrangement, for fastening a plurality of electromechanical functional elements in a control module, in which the functional elements are arranged on a carrier plate and are positively and non-positively fixed to the carrier plate by clamping elements of a pressure plate fastened to spacers of the carrier plate. These clamping elements are realized as flat centering regions of the pressure plate that match the contour of the upper outer wall of the functional elements and are surrounded by plastically deformable edge elements. In a first embodiment of this fastening arrangement, the deformable edge elements are formed by webs that have been left at the edge of the centering regions following the stamping-out of slot-shaped openings. In a second embodiment of this fastening arrangement, the deformable edge elements are each formed by a circumferential removal of material at the edge of the centering regions. The height of the spacers is less than the structural height of the functional elements, such that, when the pressure plate is mounted on the spacers of the carrier plate, the deformable edge elements are plastically and elastically deformed upon being pressed against the upper outer walls of the assigned functional elements.

A disadvantage of such a fastening arrangement is that the centering regions must be precisely positioned within the pressure plate to ensure trouble-free mounting and to avoid damage to individual functional elements. In addition, this fastening arrangement requires all functional elements to be largely of the same structural height, because the capability of the edge elements to deform without cracking is limited.

SUMMARY

The present disclosure was therefore based on the object of presenting a control module of a vehicle of the aforementioned design, the clamping elements of which can be realized with greater tolerance on the pressure plate and by which functional elements that have differing structural heights can be fixed to the carrier plate.

This object is achieved in that the spacers are of a slightly greater height than the structural height of the highest functional element, and in that the pressure plate is provided, for each of the functional elements, with at least one clamping element that is realized as a clamping tab, wherein the clamping tabs are each arranged at an opening in the pressure plate that is partially closed by the same, and are realized such that they are angled toward the carrier plate.

Advantageous designs and further developments of the control module according to the present disclosure are provided herein.

Accordingly, the present disclosure relates to a control module of a vehicle, the control module including a plurality electromechanical functional elements. The functional elements, which may be, for example, solenoid valves and pressure and temperature sensors, are arranged on a carrier plate and are positively and non-positively fixed to the carrier plate by clamping elements of a pressure plate that is fastened to spacers of the carrier plate.

As a result of the clamping elements being realized as clamping tabs that are each arranged at an opening in the pressure plate partially closed by the same and that are angled toward the carrier plate, after the pressure plate has been mounted they press with their lower outer edge onto the upper outer wall of the respective functional element, due to the slightly greater height of the spacers, whereby the clamping tabs are plastically and/or elastically deformed. Thus, no exact positioning of the clamping tabs on the pressure plate is required for fixing the functional elements to the carrier plate. In addition, the clamping tabs can be suitably adapted to different structural heights of the functional elements.

In order to increase the stability and reliability of the fixing of the functional elements to the carrier plate, the pressure plate is preferably provided, at least for one of the functional elements, with two clamping tabs that are arranged, in mirror symmetry with respect to a geometric center axis of the respective functional element, with their free ends directed toward each other, at a respective opening in the pressure plate partially closed by the same.

According to another aspect, the pressure plate is provided, at least for one of the functional elements, with two clamping tabs that are arranged, in mirror symmetry with respect to a geometric center axis of the respective functional element, with their free ends directed toward each other, at the same opening in the pressure plate that is partially closed by them.

In another aspect, the pressure plate is provided, at least for one of the functional elements, with two clamping tabs that are arranged, in point symmetry with respect to a geometric center axis of the respective functional element, in alignment with each other, at a respective opening in the pressure plate that is partially closed by the same.

In another aspect, the pressure plate is provided, at least for one of the functional elements, with two clamping tabs that are arranged, in point symmetry with respect to a geometric center axis of the respective functional element, in parallel alignment with each other, at the same opening in the pressure plate that is partially closed by them.

The clamping tabs can be easily adapted to differing structural heights of the functional elements in such a manner that the clamping tabs for the functional elements of a greater structural height are longer and more angled than the clamping tabs for the functional elements of a lesser structural height. In addition, the clamping tabs can be used to compensate any varying structural height tolerance or installation height tolerance of the functional elements after these functional elements have been mounted. In all cases mentioned, at least a defined minimum clamping force is exerted upon the functional elements by the clamping elements.

The pressure plate may be composed of a sheet metal. The clamping tabs are then each stamped out of the sheet metal defining three sides and bent over toward the carrier plate to such an extent that, when the pressure plate is fastened to the spacers of the carrier plate, the clamping tabs are plastically and/or only elastically deformed upon being pressed against the upper outer walls of the associated functional elements. As a result of this deformation of the clamping tabs, their elastic tension causes a defined contact pressure to remain upon the upper outer walls of the functional elements. In this case, therefore, it is not necessary for the angling of the clamping tabs to be executed with precision, and the afore-mentioned varying height tolerance can also be compensated according to the clamping force.

However, in another aspect, the pressure plate may also be composed of a plastic disk or plastic plate. In this case, the clamping tabs are each formed at an angle onto the edge of an opening in the pressure plate in such a manner that, when the pressure plate is fastened to the spacers of the carrier plate, the clamping tabs are only elastically deformed upon being pressed against the upper outer walls of the assigned functional elements. Because plastics, at least in a cold state, cannot be plastically deformed in a non-destructive manner, in this case it is necessary for the angling of the clamping tabs to be executed in a relatively precise manner.

BRIEF DESCRIPTION OF THE DRAWINGS

The present disclosure is explained in additional detail in the following detailed description on the basis of exemplary embodiments represented in the drawings, in which.

DETAILED DESCRIPTION OF THE DRAWINGS

Figure 1:
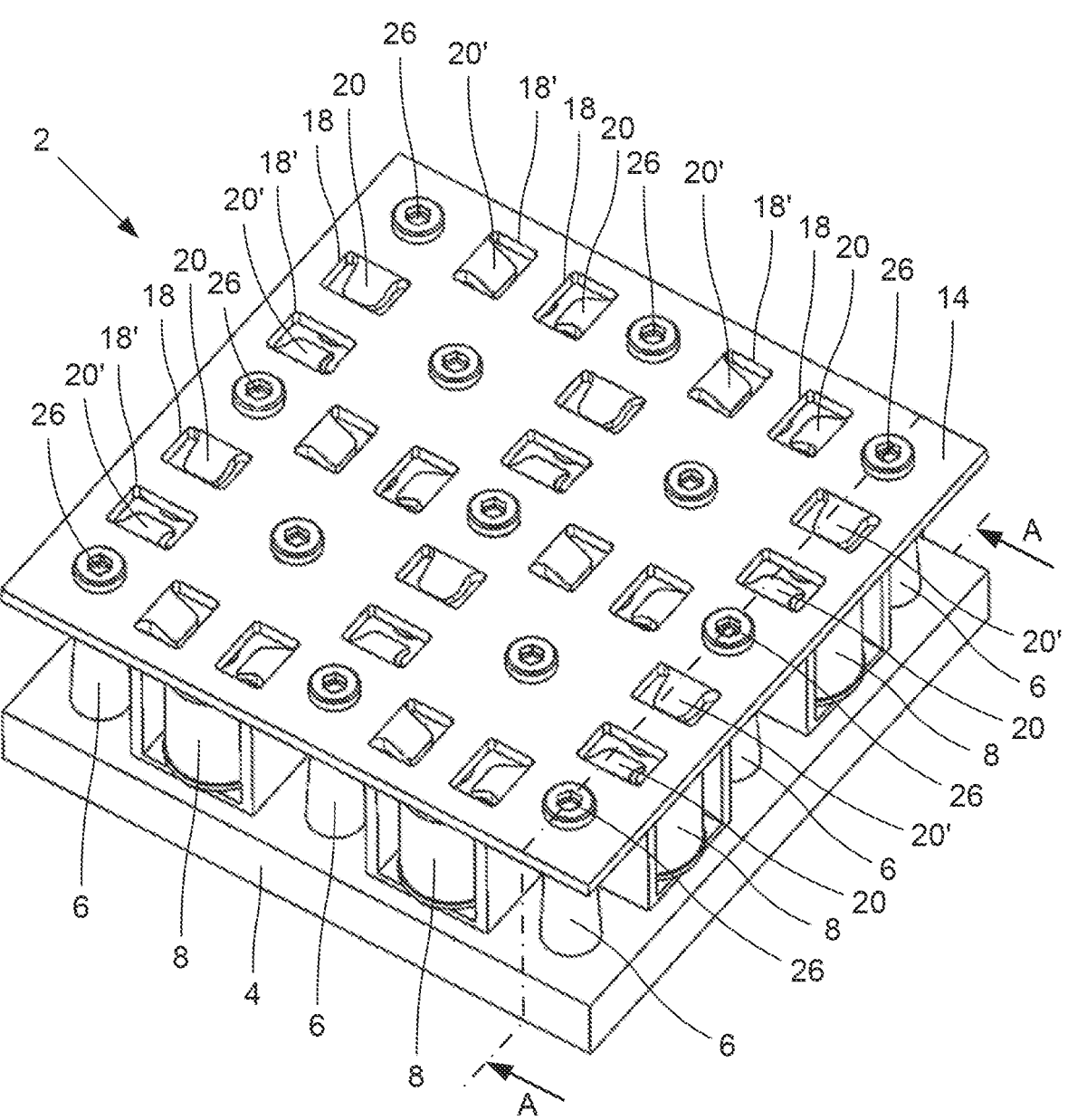
FIG. 1 is a perspective view showing a control module according to the present disclosure.

With reference to FIG. 1, a control module 2 is illustrated in perspective view and includes a carrier plate 4 having a plurality of post-shaped upwardly directed spacers 6, a plurality of electromechanical functional elements 8 arranged on the carrier plate 4, which in the present case, as an example, are solenoid valves, and a pressure plate 14, which is placed on the spacers 6 and the functional elements 8 and is fastened to the spacers 6 by a plurality of screws 26.

Figure 2A:
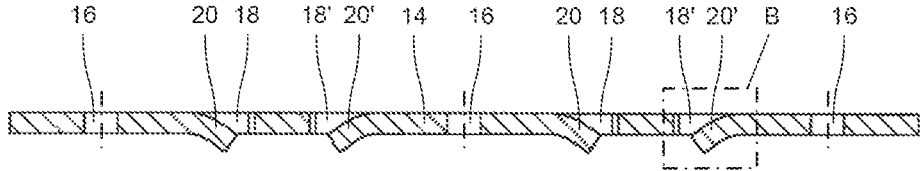
FIG. 2a is a sectional view showing a pressure plate of a control module according to FIG. 1, before mounting.
Figure 2B:
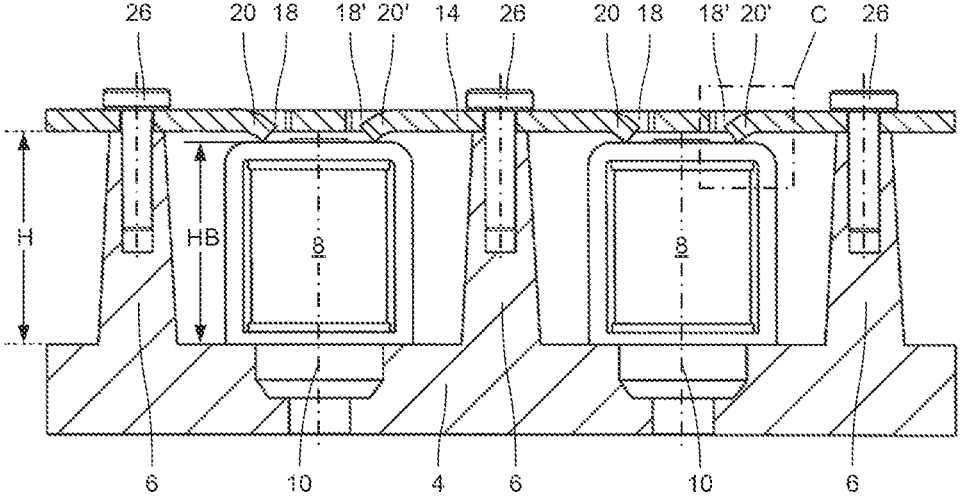
FIG. 2b is a sectional view showing the control module according to FIG. 1, after mounting of the pressure plate.
Figures 3A, 3B, 4, 5:
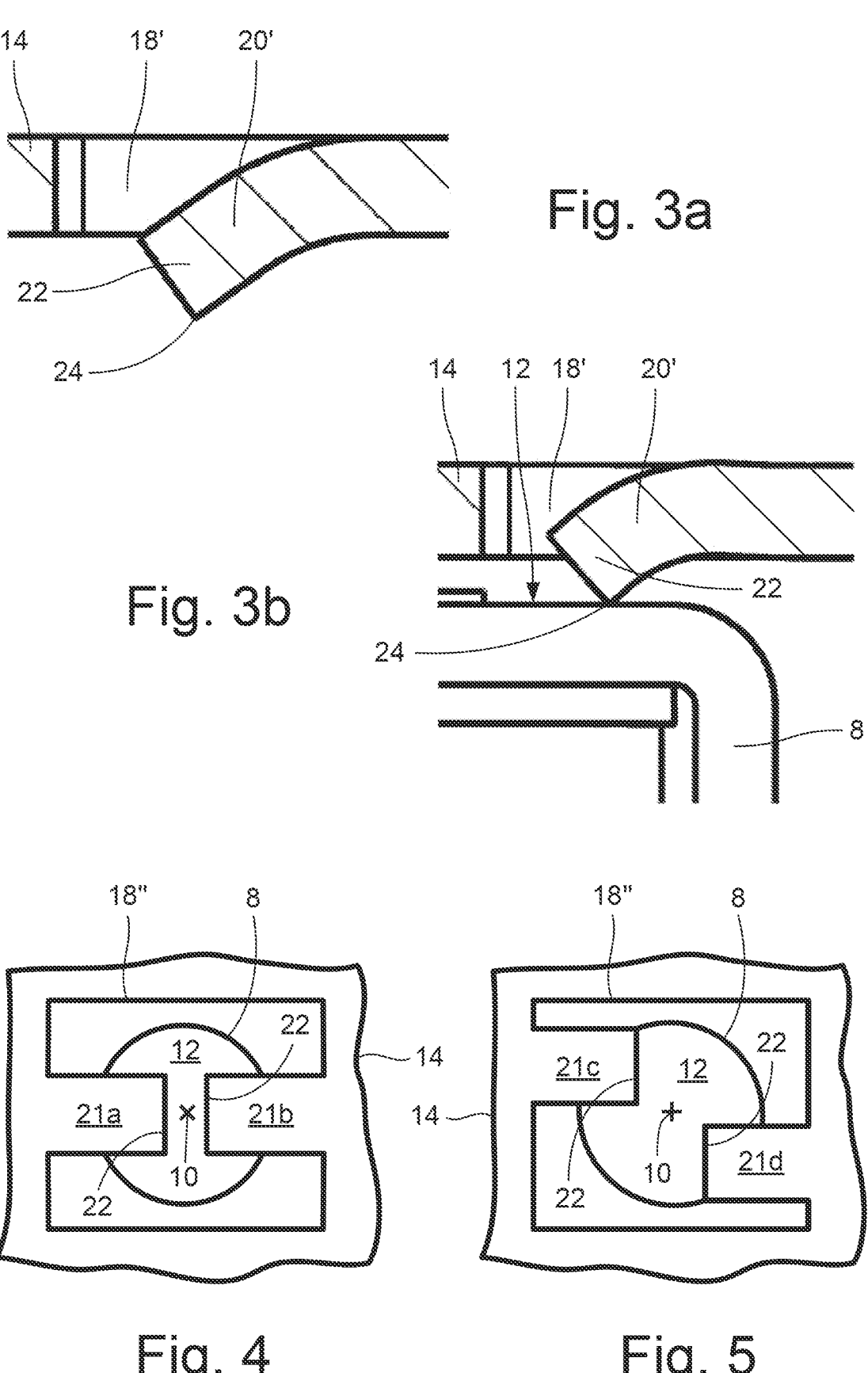
FIG. 3a is an enlarged detail of sectional view of FIG. 2a showing the pressure plate of the control module.
FIG. 3b is an enlarged detail of the sectional view of FIG. 2b showing the control module.
FIG. 4 is a detail top view of a pressure plate similar to that according to FIG. 1, in the region of an opening at which there are realized two clamping tabs that face toward each other in mirror symmetry.
FIG. 5 is a detail top view of a pressure plate as in FIG. 4, but with two clamping tabs, arranged in point symmetry and parallel to each other, that are arranged at an opening in the pressure plate.

In the sectional view of FIG. 2a and the enlarged detail B from FIG. 2a illustrated in FIG. 3a, the pressure plate 14 is illustrated, in the sectional plane A-A according to FIG. 1, in the non-mounted state. In the sectional view of FIG. 2b and the enlarged detail C from FIG. 2b illustrated in FIG. 3b, the carrier plate 4, the functional elements 8 and the pressure plate 14 are illustrated, in the sectional plane A-A according to FIG. 1, in the mounted state.

The pressure plate 14 of the present disclosure, in one aspect, is composed of a sheet metal and has a drilled hole 16 for each of the screws 26. In the present disclosure, the structural height HB of the functional elements 8 is the same for all functional elements 8, but it could also differ in magnitude. The spacers 6 are of a slightly greater height H than the structural height HB of the functional elements 8. For the purpose of positively and non-positively fixing the functional elements 8 to the carrier plate 4, the pressure plate 4 is provided with two clamping elements 20, 20', realized as clamping tabs, for each of the functional elements 8.

The clamping tabs 20, 20', as a result of being stamped out on three sides, are each arranged in an opening 18, 18' in the pressure plate 14 that is partially closed by the clamping tabs 20, 20', and are bent over toward the carrier plate 4. The two clamping tabs 20, 20' provided for each functional element 8 are arranged, in mirror symmetry with respect to the geometric center axis 10 of the assigned functional element 8, with their free ends 22 directed toward each other at the respective openings 18, 18' in the pressure plate 14. The clamping tabs 20, 20' arranged at each of the openings 18, 18' may also be point-symmetrical and aligned parallel to each other, similar to the alignment shown in FIG. 5. The clamping tabs 20, 20' are bent over toward the carrier plate 4 to such an extent that, when the pressure plate 14 is fastened to the spacers 6 of the carrier plate 4, they are plastically and/or only elastically deformed upon their respective outer edge 24 being pressed against the upper outer walls 12 of the functional elements 8.

As a result of the plastic deformation of the clamping tabs 20, 20', their elastic tension causes a defined contact pressure to remain upon the upper outer walls 12 of the functional elements 8. It is therefore not necessary for the angling of the clamping tabs 20, 20' to be executed with precision. More-over, the openings 18, 18' with the clamping tabs 20, 20' do not have to be positioned exactly for fixing the functional elements 8 within the pressure plate 14.

FIG. 4 shows a detail of a schematic top view of a pressure plate 14 similar to the pressure plate according to FIG. 1. FIG. 4 shows an opening 18" in the pressure plate 14 that is partially closed by two clamping tabs 21a, 21b. These clamping tabs 21a, 21b are integrally connected to the material of the pressure plate 14 and are bent over toward a comparatively small-diameter functional element 8. As a result, the two clamping tabs 21a, 21b exert upon the outer wall 12 of the functional element 8 a defined clamping force that holds the functional element 8 securely in its predeter-mined position. The special feature of this aspect according to FIG. 4 is that the two clamping tabs 21a, 21b acting upon the same functional element 8 are arranged in mirror sym-metry with respect to the geometric center axis 10 of the functional element 8, and with their free ends 22 directed toward each other at the same opening 18" in the pressure plate 14.

The formation, or arrangement, of two clamping tabs 21c, 21d at the same opening 18" in the pressure plate 14 is also realized in the case of another aspect, which is represented in FIG. 5. Here, the pressure plate 14 is provided with two clamping tabs 21c, 21d for the comparatively small-diam-eter functional element 8 assigned to the opening 18", which are arranged with point symmetry with respect to the geo-metric center axis 10 of the functional element 8 and aligned parallel to each other at the same opening 18" in the pressure plate 14.

The two illustrated aspects according to FIGS. 4 and 5 are particularly well applicable where comparatively small-diameter functional elements 8 are to be fixed by of the clamping tabs of the pressure plate 14.

While the above description constitutes the preferred embodiments of the present invention, it will be appreciated that the invention is susceptible to modification, variation and change without departing from the proper scope and fair meaning of the accompanying claims.

The invention claimed is:

1. A control module (2) of a vehicle, the control module comprising:

a plurality of electromechanical functional elements (8) arranged on a carrier plate (4) and positively and non-positively fixed to the carrier plate (4) by clamping elements, wherein the clamping elements are disposed on a pressure plate (14), wherein the pressure plate (14) is fastened to spacers (6) of the carrier plate (4), wherein the spacers (6) are of a greater height (H) than the structural height (HB) of the highest functional element (8), wherein, for each of the functional elements (8), the pressure plate (14) is provided with at least one of the clamping elements, wherein the clamping elements are in the form of a clamping tab (20, 20', 21*a*, 21*b*, 21*c*, 21*d*), wherein the clamping tabs (20, 20', 21*a*, 21*b*, 21*c*, 21*d*) are each arranged at an opening (18, 18', 18") in the pressure plate (14), wherein the openings (18, 18', 18") are partially closed by the clamping tabs, wherein the clamping tabs are angled toward the carrier plate (4);

wherein the clamping tabs have a lower outer edge (24), wherein the lower outer edge contacts an upper surface of the functional elements (8);

wherein the clamping tabs are, at a point of contact between the lower outer edge and the functional elements (8), angled downwardly at an oblique angle relative to the upper surface of the functional elements;

wherein the pressure plate and the carrier plate have a first installation state and a second installation state;

wherein, in the first installation state, the pressure plate is disposed above the carrier plate and fixed to the carrier plate, wherein the clamping tabs are disposed above the functional elements and not in contact with the functional elements;

wherein, in the second installation state, the clamping tabs are plastically deformed relative to the first installation state and in contact with the functional elements.

2. The control module as claimed in claim 1, wherein the pressure plate (14) is provided, at least for one of the functional elements (8), with two of the clamping tabs (20, 20') arranged, in mirror symmetry with respect to a geometric center axis (10) of the respective functional element (8), with free ends (22) of the two clamping tabs directed toward each other, at a respective opening (18, 18') in the pressure plate (14) partially closed by the respective clamping tab of the two clamping tabs.

3. The control module as claimed in claim 1, wherein the pressure plate (14) is provided, at least for one of the functional elements (8), with two clamping tabs (21*a*, 21*b*) arranged, in mirror symmetry with respect to a geometric center axis (10) of the respective functional element (8), with free ends (22) of the two clamping tabs directed toward each other, at the same opening (18") in the pressure plate (14) that is partially closed by the two clamping tabs.

4. The control module as claimed in claim 1, wherein the pressure plate (14) is provided, at least for one of the functional elements (8), with two clamping tabs (20, 20') arranged, in point symmetry with respect to a geometric center axis (10) of the respective functional element (8), in alignment with each other, at a respective opening (18, 18') in the pressure plate (14) that is partially closed by the respective clamping tab of the two clamping tabs.

5. The control module as claimed in claim 1, wherein the pressure plate (14) is provided, at least for one of the functional elements (8), with two of the clamping tabs (21*c*, 21*d*) arranged, in point symmetry with respect to a geometric center axis (10) of the respective functional element (8), in parallel alignment with each other, at the same opening (18") in the pressure plate (14) that is partially closed by the two clamping tabs.

6. The control module as claimed in claim 1, wherein the clamping tabs (20, 20', 21*a*, 21*b*, 21*c*, 21*d*) are configured to engage differing structural heights (HB) of the functional elements (8), wherein the clamping tabs (20, 20', 21*a*, 21*b*, 21*c*, 21*d*) associated with the functional elements (8) having a greater structural height (HB) are longer and more angled than the clamping tabs (20, 20', 21*a*, 21*b*, 21*c*, 21*d*) associated with the functional elements (8) of a lesser structural height (HB).

7. The control module as claimed in claim 1, wherein the pressure plate (14) is composed of a sheet metal, and the clamping tabs (20, 20', 21*a*, 21*b*, 21*c*, 21*d*) are each stamped out of the sheet metal defining three sides and bent over in the direction of the carrier plate (4) to such an extent that, when the pressure plate (14) is fastened to the spacers (6) of the carrier plate (4), the clamping tabs are pressed against upper outer walls (12) of the functional elements (8) associated therewith.

8. The control module of claim 1, wherein the functional elements are solenoid valves.

9. The control module of claim 8, wherein the carrier plate includes openings therethrough, wherein the solenoid valves are disposed above the openings.

10. A control module (2) of a vehicle, the control module comprising:

a plurality of solenoid valves (8) arranged on a carrier plate (4) and positively and non-positively fixed to the carrier plate (4) by clamping elements, wherein the clamping elements are disposed on a pressure plate (14), wherein the pressure plate (14) is fastened to spacers (6) of the carrier plate (4), wherein the spacers (6) are of a greater height (H) than the structural height (HB) of the highest solenoid valve (8), wherein, for each of the solenoid valves (8), the pressure plate (14) is provided with at least one of the clamping elements, wherein the clamping elements are in the form of a clamping tab (20, 20', 21*a*, 21*b*, 21*c*, 21*d*), wherein the clamping tabs (20, 20', 21*a*, 21*b*, 21*c*, 21*d*) are each arranged at an opening (18, 18', 18") in the pressure plate (14), wherein the openings (18, 18', 18") are partially closed by the clamping tabs, wherein the clamping tabs are angled toward the carrier plate (4);

wherein the clamping tabs have a lower outer edge (24), wherein the lower outer edge contacts an upper surface of the solenoid valves (8);

wherein the clamping tabs are, at a point of contact between the lower outer edge and the solenoid valves (8), angled downwardly at an oblique angle relative to the upper surface of the solenoid valves;

wherein the pressure plate and the carrier plate have a first installation state and a second installation state;

wherein, in the first installation state, the pressure plate is disposed above the carrier plate and fixed to the carrier plate, wherein the clamping tabs are disposed above the solenoid valves and not in contact with the solenoid valves;

wherein, in the second installation state, the clamping tabs are plastically deformed relative to the first installation state and in contact with the solenoid valves;

wherein the clamping tab has a terminal linear edge defining a terminal end of the clamping tab, wherein the linear edge is disposed at a point of contact with the solenoid valves, wherein the contact between the clamping tab and the upper surface is limited to the linear edge, wherein opposite sides of the terminal linear edge are not in contact with the upper surface of the solenoid valves;

wherein the point of contact is disposed at an outermost extent of the clamping tab.

\* \* \* \* \*